United States Patent
Connolly et al.

(10) Patent No.: US 6,467,053 B1
(45) Date of Patent: Oct. 15, 2002

(54) CAPTURED SYNCHRONOUS DRAM FAILS IN A WORKING ENVIRONMENT

(75) Inventors: Brian J. Connolly, Williston; Steven A. Grundon, Jericho; Bruce G. Hazelzet, Essex Junction; Mark W. Kellogg, Essex Junction; James R. Mallabar, Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/340,804

(22) Filed: Jun. 28, 1999

(51) Int. Cl.[7] ............................................. G06F 11/277
(52) U.S. Cl. .......................... 714/39; 714/42; 710/301
(58) Field of Search ............................ 714/39, 42, 30; 710/301, 302; 711/5

(56) References Cited

U.S. PATENT DOCUMENTS

| | | | |
|---|---|---|---|
| 3,651,315 A | | 3/1972 | Collins |
| 3,740,645 A | | 6/1973 | Cook |
| 4,001,818 A | | 1/1977 | Radichel et al. |
| 4,183,459 A | | 1/1980 | Donn et al. |
| 4,620,302 A | | 10/1986 | Binoeder et al. |
| 4,942,576 A | | 7/1990 | Busack et al. |
| 5,384,737 A | * | 1/1995 | Childs et al. .......... 365/189.04 |
| 5,475,624 A | | 12/1995 | West |
| 5,506,959 A | | 4/1996 | Cockburn |
| 5,627,838 A | | 5/1997 | Lin et al. |
| 5,754,838 A | * | 5/1998 | Shibata et al. .............. 711/105 |
| 5,784,323 A | | 7/1998 | Adams et al. |
| 5,974,570 A | * | 10/1999 | Kawaguchi et al. .......... 714/42 |
| 5,995,424 A | * | 11/1999 | Lawrence et al. .......... 365/201 |
| 6,055,653 A | * | 4/2000 | LeBlanc et al. ............. 714/718 |
| 6,178,526 B1 | * | 1/2001 | Nguyen et al. ................ 714/42 |
| 6,282,210 B1 | * | 8/2001 | Rapport et al. ............. 370/518 |

* cited by examiner

Primary Examiner—Scott Baderman
(74) Attorney, Agent, or Firm—McGuireWoods LLP; Robert A. Walsh, Esq.

(57) ABSTRACT

A Synchronous DRAM memory test assembly that converts a normal PC or Workstation with a synchronous bus into a memory tester. The test assembly may be split into two segments: a diagnostic card and an adapter card to limit mechanical load on the system socket as well as permit varying form factors. This test assembly architecture supports memory bus speeds of 66 MHz and above, and provides easy access for a logic analyzer. The test assembly supports Registered and Unbuffered Synchronous DRAM products. The test assembly permits good and questionable synchronous modules to be compared using an external logic analyzer. It permits resolution of in-system fails that occur uniquely in system environments and may be otherwise difficult or impossible to replicate. The test assembly re-drives the system clocks with a phase lock loop (PLL) buffer to a memory module socket on the test assembly to permit timing adjustments to minimize the degradation to the system's memory bus timings due to the additional wire length and loading. The test assembly is programmable to adjust to varying bus timings such as: CAS (column address strobe) Latencies and Burst Length variations. It is designed with Field Programmable Gate Arrays (FPGAs) to allow for changes internally without modifying the test assembly.

20 Claims, 8 Drawing Sheets

FIG. 6

| Sample | CardSel | BankAdr 61a → | RowAddr 61b → | ColAddr 61c → | RS_Stat | ErrorBus | TimesComp TIME BETWEEN FAILS ↓62 | Byte5 | Byte6 |
|---|---|---|---|---|---|---|---|---|---|
| 0 | UPPER | 01 | 796 | 318 | READ | FE | 0 PS | FF | FF |
| 1 | UPPER | 01 | 796 | 318 | READ | FE | 150.500 NS | FF | FF |
| 2 | UPPER | 01 | 796 | 318 | READ | FE | <198,293,6777,000 S | FF | FF |
| 3 | UPPER | 01 | 796 | 318 | READ | FE | 150.000 ms | FF | FF |
| 4 | UPPER | 01 | 796 | 318 | READ | FE | <658,618,070,000 s | FF | FF |
| 5 | UPPER | 01 | 796 | 318 | READ | FE | 150.500 ms | FF | FF |
| 6 | UPPER | 01 | 796 | 318 | READ | FE | <617,616,357,500 s | FF | FF |
| 7 | UPPER | 01 | 796 | 318 | READ | FE | 150.500 ms | FF | FF |
| 8 | UPPER | 01 | 796 | 318 | READ | FE | <580,532,086,000 s | FF | FF |
| 9 | UPPER | 01 | 796 | 318 | READ | FE | 150.500 ns | FF | FF |
| 10 | UPPER | 01 | 796 | 318 | READ | FE | <861,420,825,000 s | FF | FF |
| 11 | UPPER | 01 | 796 | 318 | READ | FE | 150.500 ns | FF | FF |
| 12 | UPPER | 01 | 796 | 318 | READ | FE | <723,091,045,000) s | FF | FF |
| 13 | UPPER | 01 | 796 | 318 | READ | FE | 150.00 ns | FF | FF |

CAPTURED SYNCHRONOUS DRAM FAILS IN A WORKING ENVIRONMENT

BACKGROUND OF THE INVENTION

1. Field of the Invention

The present invention generally relates to capturing and identifying failures in memory cards and, more particularly, to testing Dual In-line Memory Modules (DIMMs) to determine the cause and location of failures in a system environment.

2. Background Description

The industry for Personal Computers (PCs), Workstations and Laptops is building high performance systems that are utilizing Synchronous Dynamic Random Access Memories (SDRAMs). As central processing units (CPUs) become faster, memory buses must be implemented to operate at higher speeds so as not to bottleneck the system. Memory card designers are designing pluggable synchronous memory assemblies, such as Dual In-Line Memory Modules (DIMMs), to operate at synchronous memory bus speeds of 66 MHz and above.

Product engineers are required to identify root cause synchronous memory fails in real time systems. Software can be used to exercise the memory and capture the fail. This might takes months for the product engineer to capture actual cycle or multiple cycles that cause the fail. A significant risk to this method is that the software may not capture the fail. Processors have become too complex for the software to control the hardware by stepping cycles.

A memory module tester can not duplicate the exact conditions in which these Synchronous DIMMs fail. Therefore, Synchronous memory card assemblies need more tools that will capture memory fails in their actual environments.

Product engineers for synchronous memories assemblies (such as DIMMs) utilize adapter cards to characterize memory timings and analyze synchronous memory fails in computing systems such as PCs, Workstations and Laptops. Present adapter cards cause system failures in systems with memory bus timings at 100 MHz and above, mostly due to the additional wire lengths introduced with the adapter card. In systems using EDO (extended data out) memory, timings have traditionally been sufficiently lenient to permit the insertion of a module adapter card. With 66 MHz SDRAM DIMMs, margins are sufficiently tight that fails are sometimes introduced using a traditional adapter card. At 100 MHz and above, better solutions are needed.

SUMMARY OF THE INVENTION

It is therefore an object of the invention to provide a Synchronous DRAM memory test assembly that converts a normal PC or Workstation with a synchronous bus into a memory tester. This test assembly architecture supports memory bus speeds of 66 MHz and above, and provides easy access for a logic analyzer. The test assembly supports Registered and Unbuffered Synchronous DRAM DIMM products.

It is another object of the invention to provide a test assembly that re-drives the system clocks with a phase lock loop (PLL) buffer to a DIMM socket on the test assembly to permit timing adjustments to minimize the degradation to the system's memory bus timings due to the additional wire length.

The present invention permits good and questionable synchronous modules to be compared on card and the results captured using an external logic analyzer. It permits resolution of in-system fails that occur uniquely in system environments.

According to the invention, the test assembly is programmable to adjust to varying bus timings such as CAS (column address strobe) Latencies and Burst Length variations. It captures and displays the last valid Mode Register Set programmed by the system while under test. The test assembly compares data on Read and Write cycles. Data paths, such as System Data, Test Data and Error Data, can be observed. The test assembly captures and displays the device address for the current access. Field Programmable Gate Arrays (FPGAs) are utilized to allow for changes internally without modifying the test assembly.

The test assembly may be split into two segments: a diagnostic card and an adapter card. The diagnostic card is connected to the DIMM sockets via an adapter card to limit mechanical load on the system socket as well as permit varying form factors. The diagnostic card may be powered via the system power supply or an external power supply. It also provides a bit map capability to identify the failing device on the DIMM.

The test assembly provides failure information in real time via the logic analyzer display. A logic analyzer is connected to the diagnostic card via cables. The product engineer can monitor device fails under actual operating conditions via the logic analyzer. Any use of the invention will require that the user has a memory module that is suspected of causing a failure in a PC application. First the adapter card must be installed in a memory socket of the PC. The suspect memory module may be installed in either the system socket of the adapter card or the test socket. If the system socket is used, the memory faults will cause aberrant behavior in the PC application, perhaps a line of diagnostic output in a test program or a system crash in a non-robust application. This will allow for rough visual correlation between that failure event and an error detected by the present invention in that the light emitting diodes (LEDs) will light or the Logic Analyzer will trigger at the same time the PC shows the fault. If the suspect module is installed in the test socket, the PC application will not show the fault, but will indicate that a memory failure has occurred. One skilled in the art of diagnosing memory fails will understand to connect their logic analyzer in a fashion meaningful to the problem at hand and to receive the type of information required.

BRIEF DESCRIPTION OF THE DRAWINGS

The foregoing and other objects, aspects and advantages will be better understood from the following detailed description of a preferred embodiment of the invention with reference to the drawings, in which:

FIGS. 6, 7 and 8 are screen prints of memory failure information as displayed by a logic analyzer.

DETAILED DESCRIPTION OF A PREFERRED EMBODIMENT OF THE INVENTION

The present invention permits good and questionable synchronous memory modules to be compared using an external logic analyzer. It permits resolution of in-system fails that occur uniquely in system environments. Existing adapter/diagnostic cards do not have a facility to modify the system clock to adjust for hold and setup time violations that occur when the adapter/diagnostic card is introduced in a system. Present adapter cards do not fully support characterizing Unbuffered DIMMS or Registered DIMMs. The present invention provides Product engineers with an adapter/diagnostic card that permits probing the system memory bus without degrading system bus timings, as well as characterizing either Register DIMMs or Unbuffered Synchronous DIMMs.

The present invention operates in an actual operational environment testing synchronous DRAM-based memory cards. It operates at the memory interface monitoring the bus cycles which allow the user to:

isolate the problem on the memory, analyze the pattern of a real fail using the card to flag errors, permits a memory module to be operated normally while capturing command, address and data patterns, and permits a second module to see identical commands, address and data patterns, and completes a logical comparison to determine if failures occur.

An advantage of the present invention is that an adapter card with the system clocks re-driven permits timing adjustments to be made to minimize the effects of additional wire length on the adapter card. This design is ideal for system bus timings of 100 MHz and above.

Re-driven system clocks permit registers to be connected to the system bus in parallel to the system socket. This limits system loading and permits system level probing in an operational system, delayed by only one clock cycle.

Figure 1:
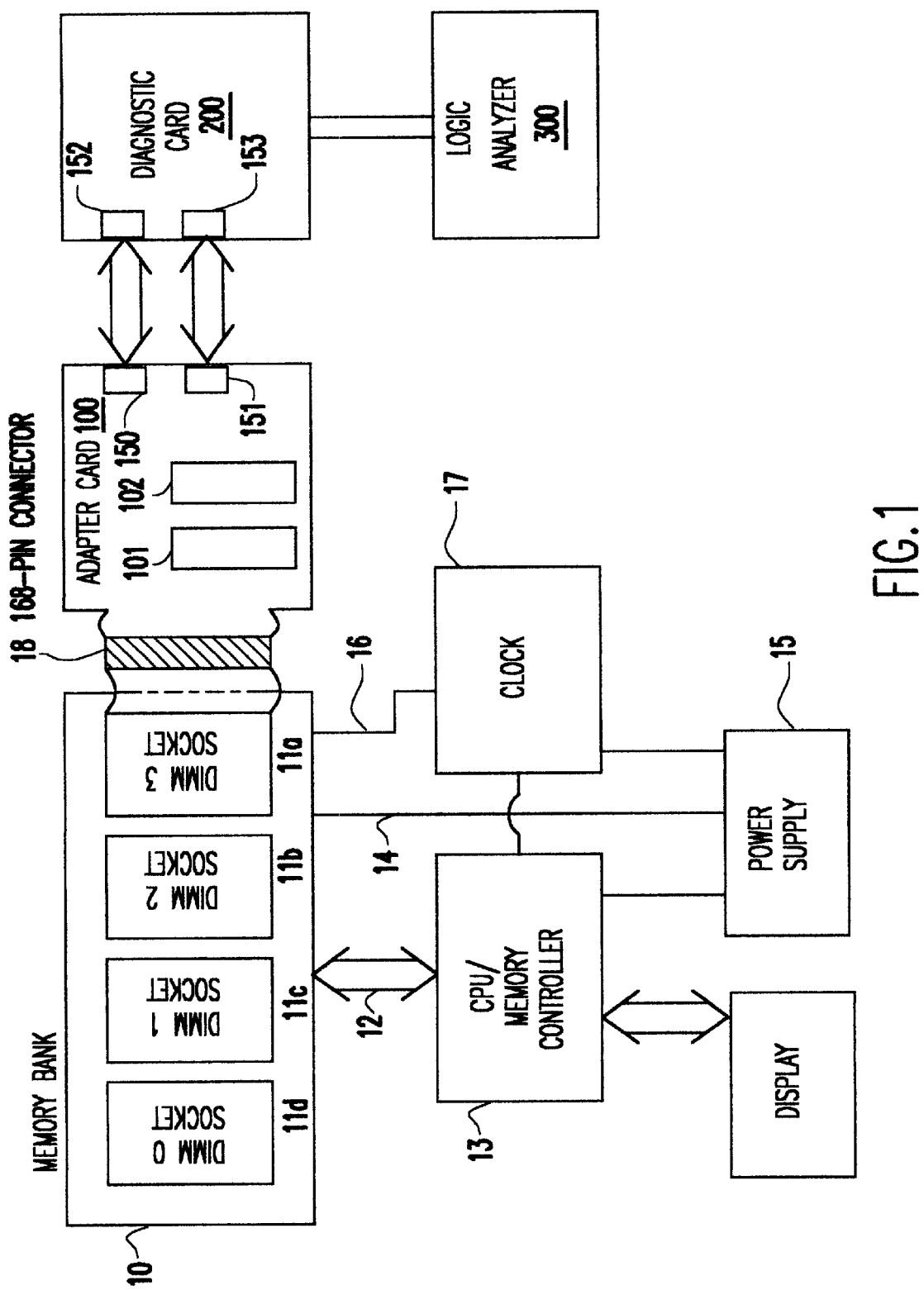
FIG. 1 is a block diagram showing the interconnections of the PC DIMM sockets, adapter card, diagnostic card and monitoring devices.

Referring now to the drawings, and more particularly to FIG. 1, there is shown the top level schematic of the invention. The test assembly is segmented into two cards. The first card is the adapter card 100 with one end configured as a 168-pin industry standard DIMN interface 18 connecting to a 168-pin DIMM socket 11 in memory bank 10. All signals are transported from the system to the adapter board through this interface. The memory bank 10 is connected in the traditional fashion with embedded wires, called land patterns 12 and through the motherboard to the CPU/memory controller 13. The memory bank 10 is also connected to a power line 14, connected to a PC power supply 15, and one or more clock lines 16 connected to the system clock 17. The DIMMs to be compared are then connected to the adapter card at first DIMM socket 101 and second DIMM socket 102. The second card is the diagnostic card 200 which connects to the adapter card 100 via two high frequency data ribbons at microstrip connecters 150, 151, 152 and 153. A logic analyzer 300 is connected to the diagnostic card 200 to capture and identify device failures and memory bus activity.

Typically, a PC has four DIMM slots 11a through 11d in memory bank 10. The present invention can be used in any or all of the DIMM slots 11 to diagnose failures, limited only by power requirements and form/fit issues.

The diagnostic card 200 architecture supports memory bus speeds of 66 MHz and above and provides easy access for a logic analyzer 300. The diagnostic card 200 supports Registered and Unbuffered Synchronous DRAM DIMM products.

Figure 2:
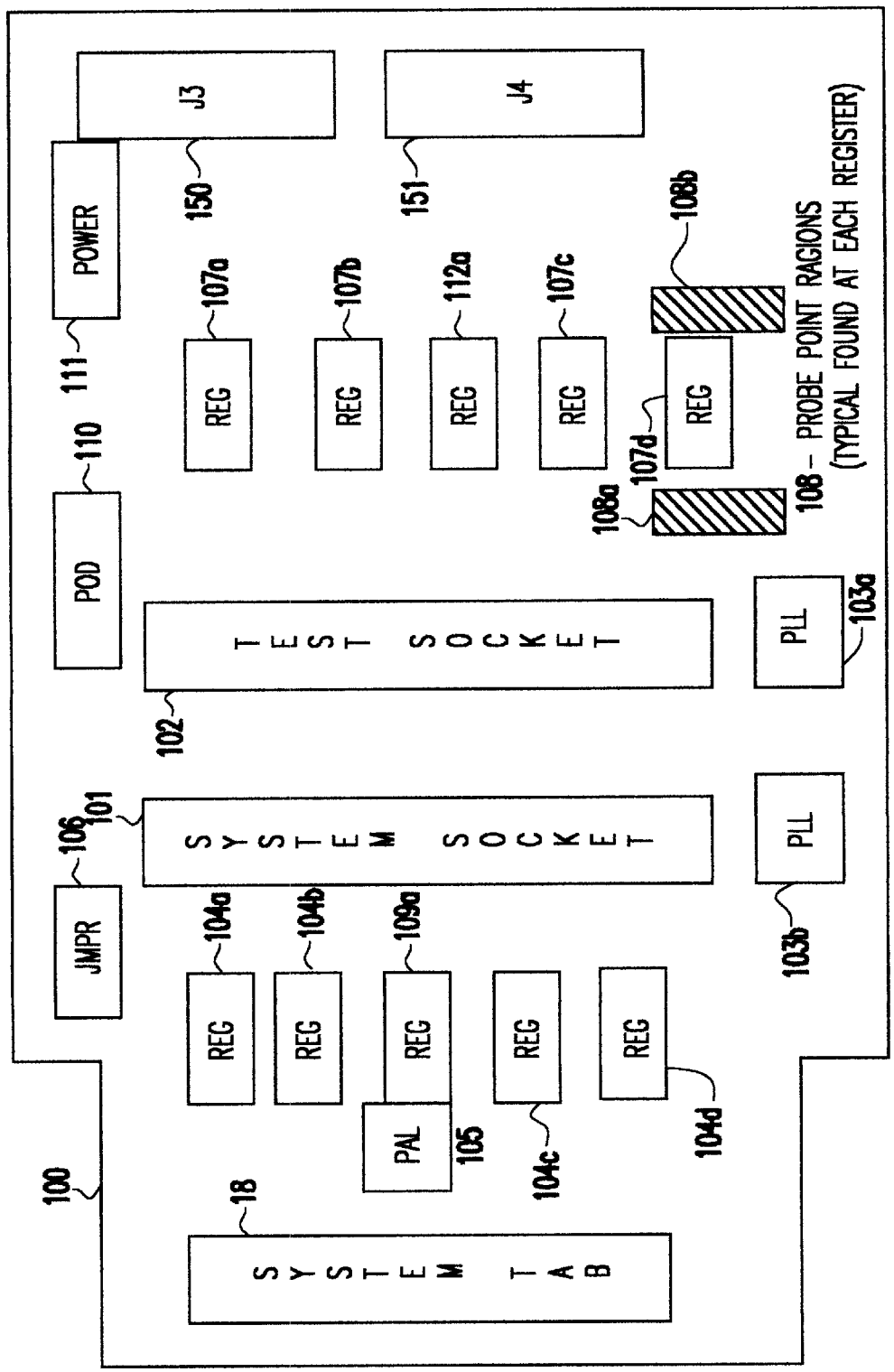
FIG. 2 is a plan view showing the layout of the adapter card.
Figure 3:
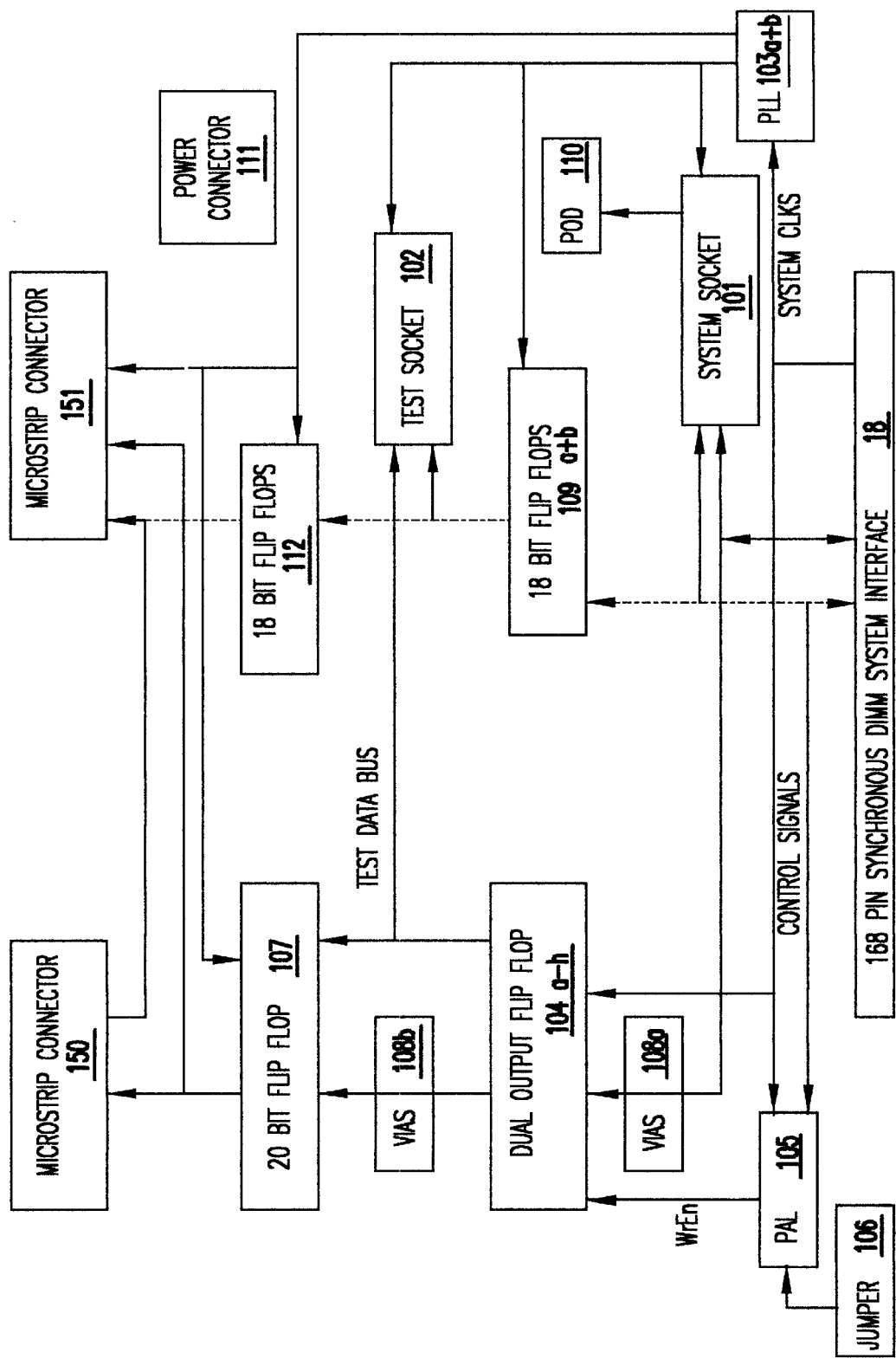
FIG. 3 is a data flow diagram of the adapter card.

Referring now to FIG. 2, a plan view shows the layout of the adapter card. The design of this card can be better explained by viewing FIG. 3 which shows the data flow of the adapter card. Referring now to FIG. 3, the adapter card 100 re-drives the system clocks with phase lock loop (PLL) buffers 103a and 103b to respective DIMM sockets 101 and 102. The System DIMM Socket 101 is used for a known good DIMM. Every signal from the 168-pin industry standard DIMM interface 18 connected to the corresponding pin in this socket with the exception of the four clocks, which come from the PLL 103a. Test DIMM Socket 102 is identical to System DIMM Socket 101 except that it is used for the unknown DIMM to be tested. Control signals to this socket are driven from D-Flip Flop (FF) Registers 109. Data signals are driven from Dual Output Registers 104a–h. Clocks are driven from the PLL 103a.

The PLL 103a and 103b clock re-drivers are adjacent to DIMM sockets 101 and 102, as shown in FIG. 2. Reference inputs are taken from the System Interface tab 18. PLL 103a drives the clocks to the two DIMM sockets and PLL 103b drives the clocks to the register banks 107 and 112. One skilled in the art will know the importance of keeping proper clock balancing to assure minimal skew between all clock inputs to each DIMM and register.

This re-driving of the clocks permits timing adjustments to minimize the degradation to the system's memory bus timings due to the additional wire length and loading of the adapter card. The adapter card architecture captures all system signals on the rising edge of the system clock which is a included on the 168-pin industry standard DIMM interface 18. Data is latched into 10-bit Dual Output Flip Flop (FF) registers 104 with dual outputs. Registers 104a–d are on the front of the adapter card, as shown in FIG. 2, and registers 104e–h are in a similar location on the reverse of the card and are not shown. These registers are clocked by one of the System clocks directly from the 168-pin industry standard DIMM interface 18. Inputs are the 80 System Data lines from the System Interface. One set of outputs drives system data to the Data Re-driving registers 107, described below. The other set of outputs drives system data to the Test DIMM socket 102 during write cycles. This set of outputs is enabled using the PAL (programmable array logic) 105.

The PAL 105 performs a decode in real time to enable and disable the tristate outputs of these registers to avoid data contention during read cycles. The PAL 105 receives signals from the 168-pin industry standard DIMM interface 18 and the CL=1 Jumper 106. The logic of the PAL 105 disables one set of outputs from register 104 when the DIMMs in sockets 101 and 102 are driving data in response to a read command. If the jumper 106 is tied to ground, CL=1 mode is selected and the PAL output disables register 104 one clock cycle after the read command is issued. If jumper 106 is tied to Vcc, CL=2 mode is selected and the register 104 is disabled two clock cycles after the read command. The registers are re-enabled immediately upon any valid command with the system Write Enable (WE) line low. Signals from the 168-pin industry standard DIMM interface 18 captured and used by the PAL are the four select lines, CAS and WE.

There are eight 20-bit Flip Flop registers 107. Four are located on the front of the card as shown in FIG. 2, and four are located on the back of the card (not shown). Inputs to these registers are from the System DIMM Socket 101 and the Test DIMM Socket 102. Outputs are the ribbon cable connectors 150 and 151 going to the diagnostic card (not shown). Registers are clocked by signals driven by PLL 103b. Again, care must be used to assure clocks are properly balanced.

The feedback loop for each PLL 103 in the adapter card 100 has multiple paths. These multiple paths permit fine tuning of the clocks on the memory modules and adapter card registers to the system clock (not shown). Referring to the two synchronous DIMM sockets 101 and 102, one socket 101 is for observing Unbuffered or Registered Synchronous DIMMs in their conventional application, and the second has a set of registers 107a to 107h to re-drive the address and controls signals such as DQMs, Addresses, RAS, etc. Although for simplification, only one set of probe points 108 is shown, in FIG. 2, there is a separate set of probe points, or Vias, 108 located on either side of each register 104, 107, and 109 and 112 to measure both input 108a and output 108b of each register. The Vias are common to front and back. This allows for simplified probing with an oscilloscope. Four 18-bit Flip Flop Registers 109a and 112a, as shown in FIG. 2, and 109b and 112b (not shown) are used to pass control signals to the diagnostic card. Register 109a and 112a receive inputs from the 168-pin industry standard DIMM interface 18 and drive both the Test DIMM Socket 102 and additional registers 112a and 112b. Registers 112a and 112b drive the control signals through the ribbon cables 150 and 151 to the diagnostic card (not shown).

The adapter card 100 has a power connector 111 tied to its power and ground planes. An external cable can be used to connect and supply power to the diagnostic card, if the diagnostic card does not have its own external power source. A Pod 110 is a Logic Analyzer Header connected to the serial presence detect signal pins of the system DIMM socket 101.

One skilled in the art would be able to customize each part of the adapter card, as described, to their own preferences. In alternative embodiments of the invention, Registers could be connected in parallel to the DIMM socket 102 to permit bus timings and system memory fails to be analyzed a mere one clock cycle later. In addition, the adapter card could be redesigned to have multiple test sockets with additional microstrip connectors to test multiple DIMMs at the same time.

Referring again to FIG. 1, the diagnostic card 200 is connected to the adapter card 100 via two high speed ribbon cables at connectors 150, 151, 152 and 153. A re-driven clock signal is sent from the adapter card to the diagnostic card via each cable so that the data from each DIMM may be re-synchronized in the diagnostic card 200. Other signals transported via the ribbon cables 150 and 151 are the synchronous control signals, the system data bus, and the test data bus.

Figure 4:
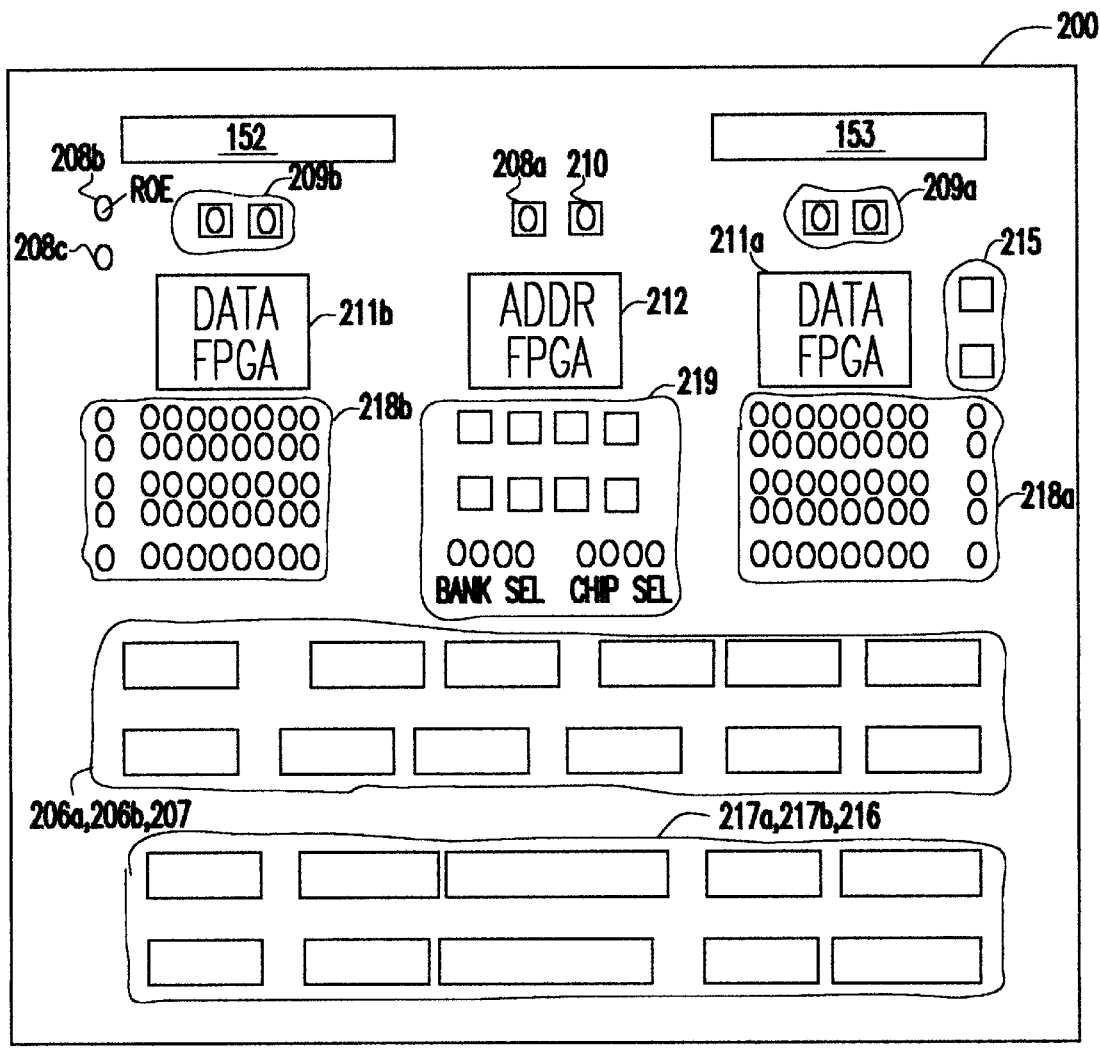
FIG. 4 is a plan view showing the layout of the diagnostic card.
Figure 5:
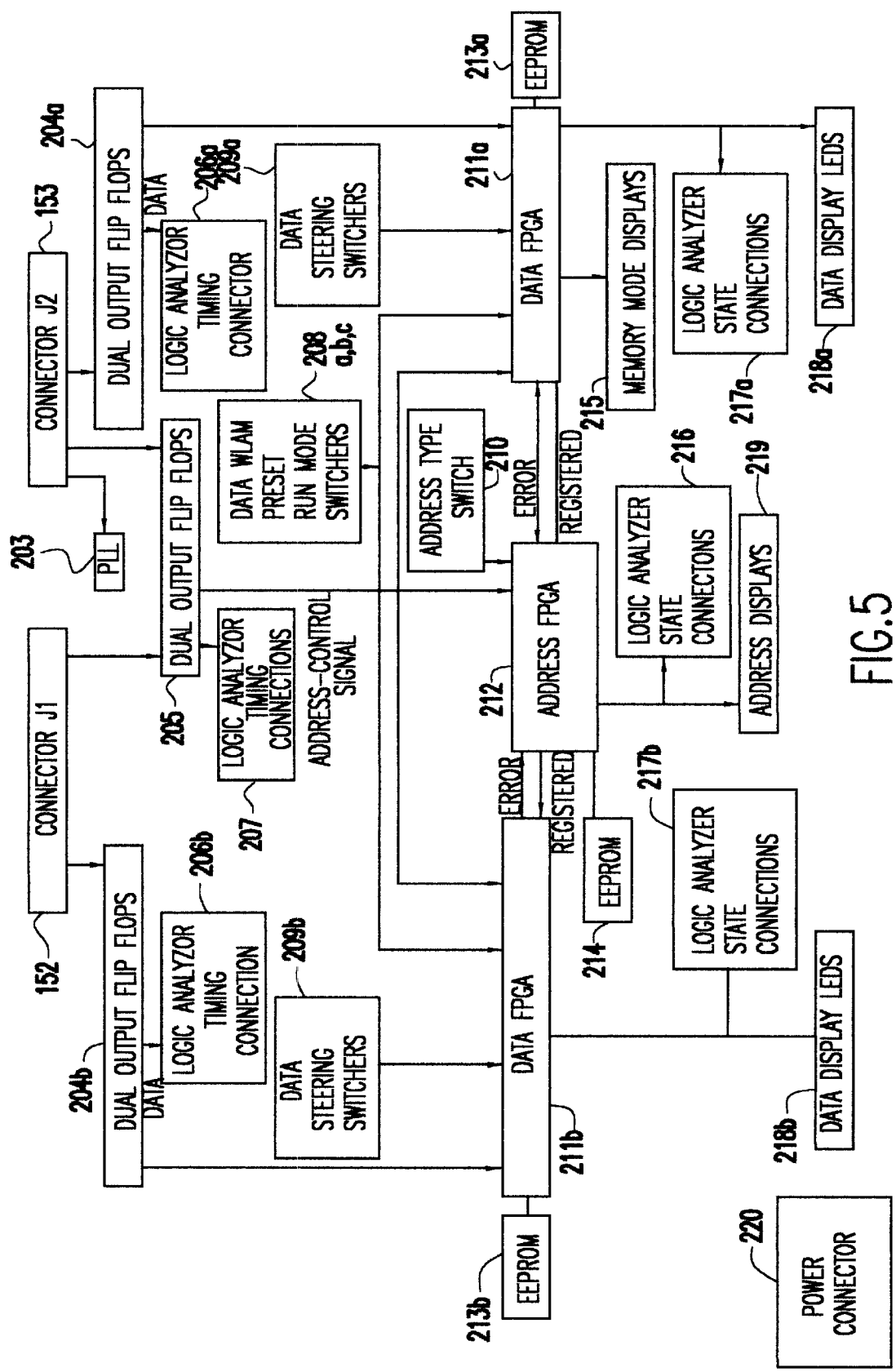
FIG. 5 is a data flow diagram of the diagnostic card.

FIG. 4 shows a layout diagram of the diagnostic card 200. The design of this card can be better explained by viewing FIG. 5 which shows the data flow of the diagnostic card. Referring now to FIG. 5, a more detailed data flow of the diagnostic card is described. The diagnostic card 200 is programmable to adjust to varying bus timings such as CAS (column address strobe) Latencies and Burst Length variations. It displays the last valid Mode Register Set programmed by the system while under test. The diagnostic card compares data on Read and Write cycles. Selectable data paths, such as System Data, Test Data and Error Data, can be observed. The test assembly captures and displays the device address for the current access. Field Programmable Gate Arrays (FPGAs) 211 and 212 are utilized to allow for changes internally without modifying the test assembly.

The diagnostic card may be powered via the system power supply or an external power supply. A separate power supply enables the card to be fully powered and initialized when the adapter card is first powered up. Thus a first fail can be detected without a loss or delay of data due to synchronization problems at system power up time. The diagnostic card provides a bit map capability to identify the failing device on the DIMM. The diagnostic card is connected via an adapter card to limit mechanical load on the system socket as well as permit varying form factors.

Connectors 152 and 153 accept the same ribbon cables as connectors 150 and 151 of the adapter card. The PLL 203 is used to re-drive the clock signal received from the adapter card. The re-driven clocks are then distributed to the Flip Flops 204 and 205, the FPGAs 211 and 212, and the Logic Analyzer Timing Connections 207. One skilled in the art will recognize the importance of balancing clock loads.

Dual Output Flip Flops 204 receive data bits from the adapter card. One set of outputs drives the FPGA 211 Data inputs. The other set drives the Logic Analyzer Timing Connections 206. This reduces loading and noise on the FPGA inputs. One skilled in the art will be able to customize the type and placement of the Flip Flops to their own application. In the current embodiment, the data bits are divided equally into a left and right half while on the adapter card. The division roughly corresponds to the left and right half of a DIMM. This reduces the amount of cross talk and eases wiring of both cards as data bits do not have to cross over each other.

Dual Output Flip Flops 205 receive Address and control signals from the adapter card. One set of outputs drives inputs to all three FPGAs 211 a, 211b, and 212. The other set of drives Logic Analyzer Timing Connections 207. Logic Analyzer Timing Connections 206 and 207 provide easy access to the latched timing signals. All data and control signals are available at the Logic Analyzer Timing Connections for diagnosis of failure patterns and verification that the adapter card and cables are functioning properly. The current embodiment uses 3M Header Connectors to mate with a Hewlett Packard 1650-63203 Termination Adapter. Alternative versions of the Diagnostic card could use combinations of high density Mictor connectors, simple header pin strips, or another connector as determined by the designer.

The user sets the Data Width Switch 208a to determine the data width that should be compared. The setting is read by the Data FPGAs 211. The current embodiment allows for 64, 72 or 80 bits as standard DIMM Data Widths. In any case, both the System and Test DIMMs Installed on the adapter card must have at least as many data bits as specified by this switch.

The Reset Switch 208b allows the user to clear any errors latched by the FPGAs 211. Both FPGAs must monitor this switch. The user sets the Run Mode Switch 208c to determine whether the diagnostic card should stop processing after finding one error or clear the error automatically. Both FPGAs must monitor this switch, also. Each data FPGA 211 has a unique set of Data Steering Switches 209 to allow for a specific data steering combination. Each data byte has three pieces of information with it, System Data, Test Data, and Error Data (the difference between System and Test Data). In the current embodiment, the data is broken into five pairs of bytes (each byte is eight bits wide). By using different combinations of the data steering switches, the user can specify what the FPGA is going to drive to both the Logic Analyzer State connections 217 and the Data Display LEDs 218. The following Table may be used as an example of what could be displayed for any pair of Data bytes A and B on Display A and Display B.

| Display A | System A | System A | Test B | System A | Error B | Error A |
|---|---|---|---|---|---|---|
| Display B | System B | Test A | System B | Error A | System B | Error B |

The Address Type switch 210 is selected by the user to match the addressing mode of the DIMMs under test. This switch is monitored by the Address FPGA 212. The current embodiment of the invention allows the user to determine the maximum row and column address driven to the Logic Analyzer State Connections 216 and Address Displays 219 to eliminate the need to simplify the addresses when the most significant bits are not used. The user also determines if the DIMMs under test are registered or unbuffered. The Data FPGAs 211 compare the system versus test data as described below. In the current embodiment of the invention there are two identical FPGAs programmed with the same code. In alternative designs the logic of the two FPGAs could be merged into one unit, either a large FPGA or an Application Specific Integrated Circuit (ASIC). A description of the logic in each of the Data FPGAs 211 is described below.

Each Data FPGA 211 generates a total of five error signals during each memory transaction. Four error signals correspond to the four Synchronous Data Mask Signals (DQM), that are inputs to a single FPGA. These four error signals are driven to the State Logic Analyzer connections 217 and the Data Display LEDs 218. When a data bit is found to be different between the system and test data busses, the error signal for the byte containing that bit is driven to the active state. One skilled in the art will understand the design of the memory modules being tested to know the relationship between the data bits and DQMs. Multiple error signals may be active at the same time if failures have occurred in multiple bytes. The fifth error signal is active if one or more of the first four error signals are active, indicating that an error of some type has occurred.

The mode register set command transmitted from the System Memory Controller to the DIMM is monitored to capture memory mode parameters such as burst Length, CAS Latency, and burst sequence. These parameters must be stored in the FPGAs to determine when data should be compared. These parameters are also driven out of the FPGA to the Memory Mode Displays 215 and State analyzer pods 217.

Data Steering Switches 209 are monitored and the appropriate data is driven to the Data Display LEDS 218 and the State Logic Analyzer Connections 217. During a read or write command, the data FPGAs 211 compare the data presented on System versus Test Data busses. The comparison must be delayed by the appropriate delay based on the command, CAS latency, and addressing mode, (registered or unbuffered as Determined by the Address Type switch 210 and Address FPGA 212). When the comparison is complete an error signal will be generated if the System and Test Data are not identical. A master error signal is driven to the Address FPGA 212 that will halt its processing, and individual byte error signals are driven to the Data Display LEDs 218 and the Logic Analyzer State Connections 217.

Read and write status flags are also driven to the analyzer pods at this time. When an error is present and reported, the Reset and Run Mode switches 208 are monitored to determine if the error flags should be reset. The FPGA continues to compare all bits when an error is latched and will latch additional errors on different bits. No errors are cleared until the user activates either the Reset Switch 208b or the Run on Error mode Switch 208c.

Address FPGA 212 works with the data FPGAs 211 to capture the memory address of any failures. In future embodiments of the invention this logic could be absorbed into either or both of the data logic devices. The logic in the current embodiment is as described below.

The Address Type Switch 210 is monitored to determine which Address bits are valid during Row and Column command cycles. A flag indicating registered or unbuffered mode Is also sent to the Data FPGAs 211 based on this switch.

During a Synchronous Memory Bank Activate Command the address FPGA stores the Bank and Row address opened.

During a Synchronous Memory Read or Write command the Address FPGA latches the Bank and Column address accessed. The bank, row, and column address are then driven to the Address Displays 219 and the Logic Analyzer State connections 217 at the time when the data FPGA 211 has completed the comparisons. The valid address bits are displayed based upon the address type switch 210.

The error signal from the Data FPGAs 211 are monitored. When set, the address displays are latched and not changed to reflect the most recent memory cycle.

The Erasable Programmable Read Only Memory (EPROM) 213 contains the instructions to program the Data FPGA 211 upon power up pf the diagnostic card. This enables a designer to modify the processing done by the Diagnostic Card without modifying the card physically by programming a new EPROM. In the current embodiment the two Data EPROMs 213 contain the same information. One skilled in the art will be able to determine which FPGA/EPROM pair best fits their application. EPROM 214 contains the instructions needed to program the address FPGA 212 upon power up of the diagnostic card.

Memory Mode Displays 215 take data from one of the Data FPGAs 211 and drives the memory mode displays. These displays give quick visual verification to the operator that the Diagnostic Card has initialized and is starting to work properly. In the current embodiment, CAS Latency and Burst Length are displayed using hex displays, burst sequence is displayed using a single LED.

Logic Analyzer State Connections 216 receive data from the Address FPGA 212. It is similar to the Timing Connections 206 and 207. The Address of the current Memory cycle is driven here by the FPGA.

Logic Analyzer State Connections 217 receive data from the Data FPGAs 211. These connectors are similar to items 206 and 207 and, enable the user easy access to the data after it is processed by the FPGAs. The data driven here is selected by the Data Steering Switches 209.

Data is displayed on Data Display LEDs 218. The data displayed is identical to that on the Logic Analyzer State Connections 217. This gives the user quick and easy visual verification as to the current status of the system. In the current embodiment each data byte is provided with a unique error LED that indicates that one of the eight bits in that byte has failed. Using the data steering switches 209 the user can then determine which bit failed and the data state of the failure.

Address Displays 219 receive data from the Address FPGA 212. The information displayed here is identical to that driven to the Logic Analyzer State Connections 216. This gives the user visual verification of the address of the fail when the error is latched.

Power connector 220 provides power to all components on the diagnostic card. This can be connected either to a similar connector as power connector 111 on the adapter card or a separate power supply. This allows the flexibility of being able to work an environment where the system cannot supply the voltage or current required to operate the diagnostic card. A user may also want to use an external power supply to assure the diagnostic card is powered and initialized before the Memory controller Issues a Mode Register Set command.

Figure 7:
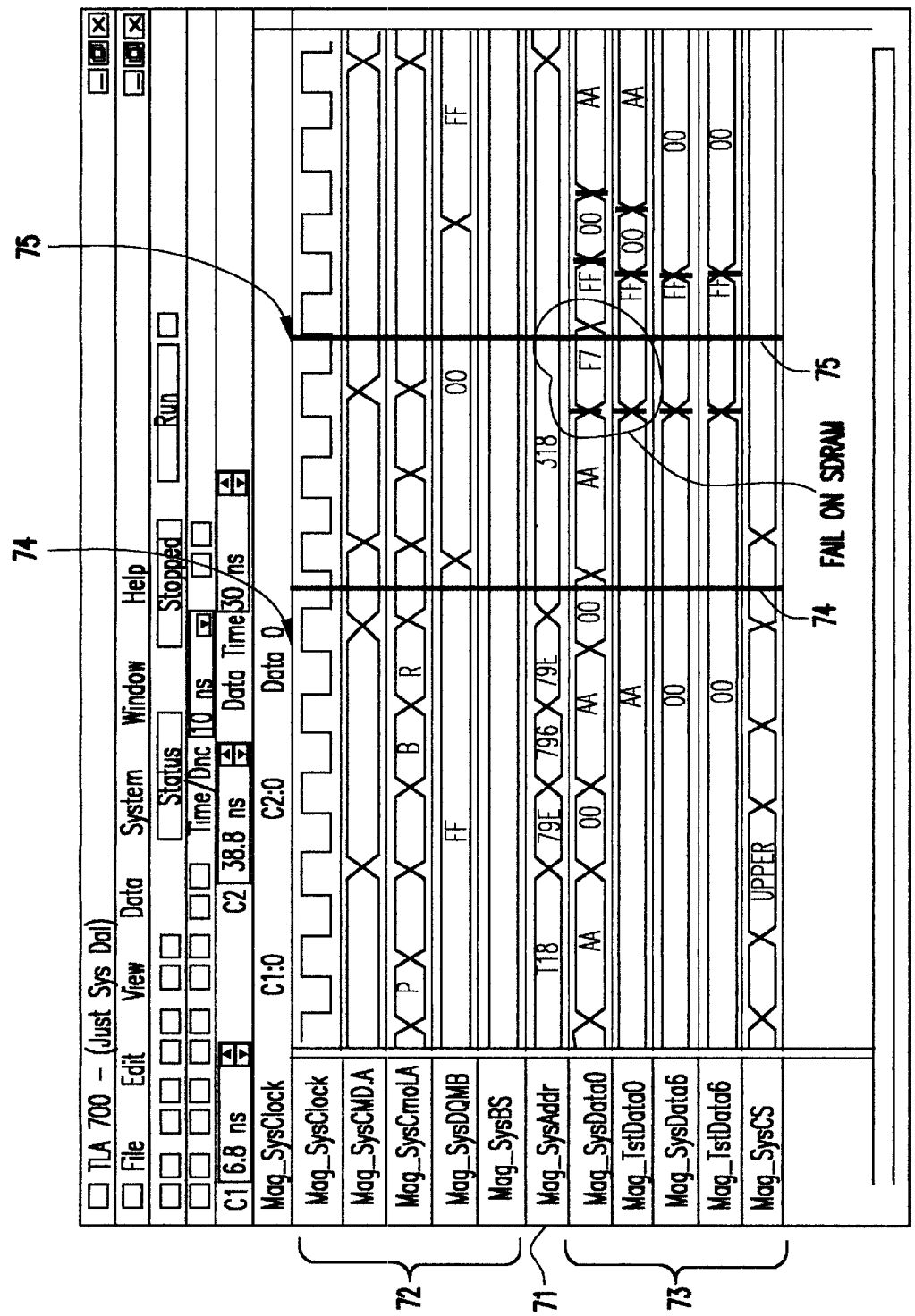
Figure 8:
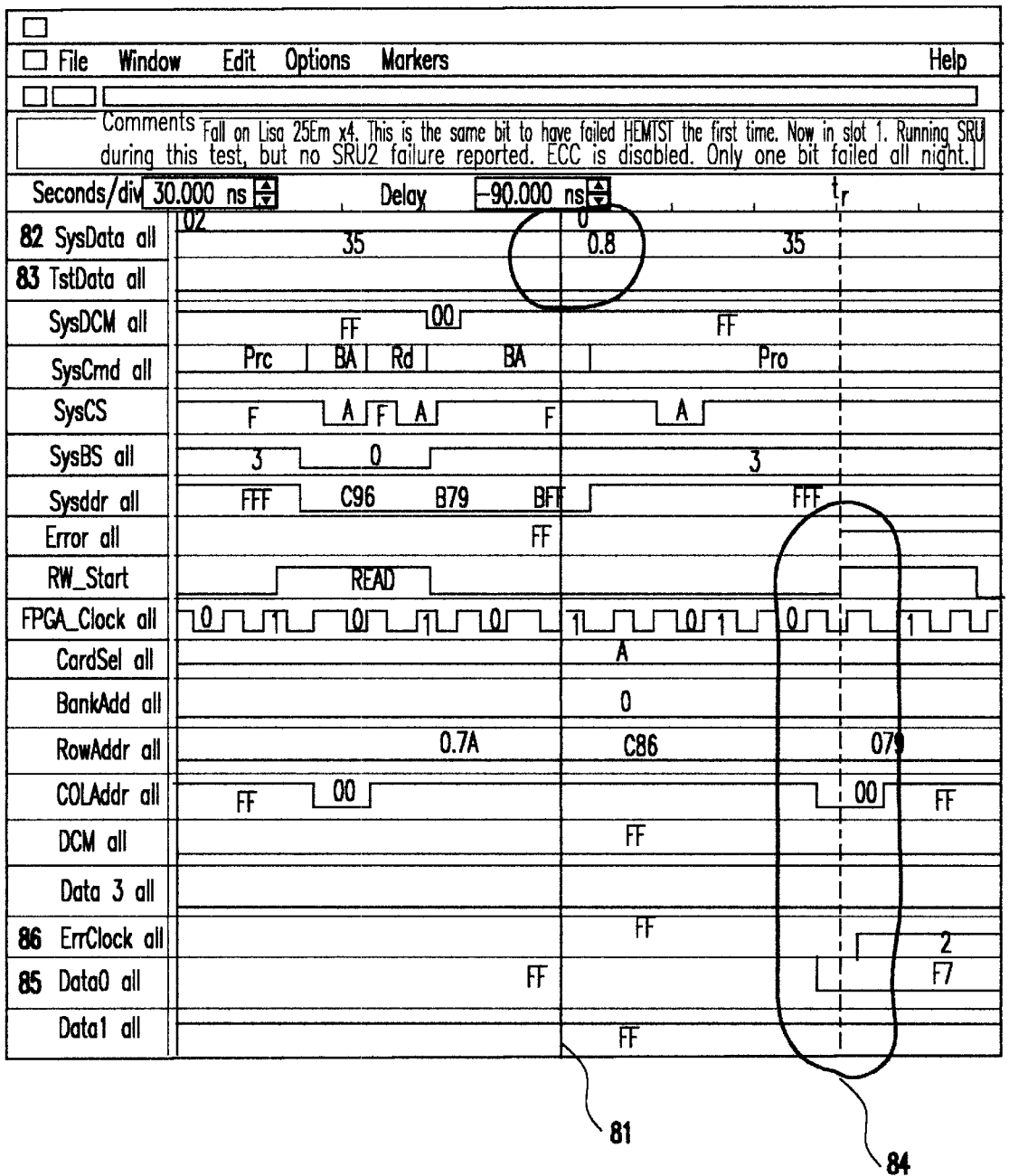

FIGS. 6, 7 and 8 are examples of the preferred embodiment of the diagnostic card and utilization of two different Logic Analyzers connected to the present invention.

FIG. 6 shows a state listing using the error clock output of a Data FPGA as an external clock to the logic analyzer. Other signals used are the State address signals (CardSel, BankAddr, RowAddr, and ColAddr) 216, as shown in FIG. 5, from the Address FPGA, the Read/Write Status Lines, the error bus, and the various data bytes generated by the Data FPGAs. Sample number and Timestamps are values supplied by the logic analyzer. The user would typically select the Error displays using the Data Steering Switches. Also, the user must select "Run on Error" mode to assure the FPGA pulses the error signal for only one clock period. In this particular example, several fails are generated over an extended period of time. For each fail, the address 61 and failing byte are displayed, as well as the time between fails 62 as calculated by the logic analyzer. Not shown is the data display that would indicate which bit of data is in error. If the failing byte is known and constant, the user could use the data select switches to display both the Error and actual data from the failing byte, so the bit and data state of each fail could be seen and analyzed.

FIG. 7 Shows a display of the Address 71, Control 72 and Data 73 signals taken from the logic analyzer timing connections 207 and 206, as shown in FIG. 5. The logic analyzer was triggered using the same error pulse used in FIG. 6, but the timing trace is triggered just once, Multiple fails will not be captured unless they are in close proximity to each other, The timing relationship between the Read Command (Vertical cursor one 74, indicated by an R in the CmdB trace), and the error (Vertical cursor two 75, where SysData and TstData are different). These timing relationships are accurate for the Test Socket. The actual system timings may have a different relationship between a signal edge and the clock. This may be determined using an oscilloscope connected to the probe points 108 of the adapter card. An external trigger to the oscilloscope can be used to display the actual system timings at the time of a fail.

FIG. 8 shows the relationship between the timing connections and the state connections in the current embodiment of the invention. Using different computational logic and/or different hardware, may change this relationship. A fail is shown on the timing connections at the first vertical bar 81 where SysData 82 and TstData 83 are different. Approximately 110 ns later at the second vertical bar 84, the error is latched as shown by one bit of Data0 85 going low and the ErrClock 86 going, high.

Another application of a Logic Analyzer utilizing the State Connections of the invention is to monitor memory transactions to one or more addresses. A logic analyzer can be configured to use the State clock to capture only these transactions when the read/write status lines are active and the Card, Bank, Row, and/or Column Address signals match the desired pattern. This could be used, for example, after the user has determined, through the method as described in FIG. 6, that a single address fails repeatedly. By monitoring all accesses to that address the user can determine the frequency of both failures and successful reads. Also, the time between a write and a failure can be easily determined. By expanding the range of addresses monitored the user may be able to determine that an access of a particular data pattern to one address causes a fail at another.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A synchronous memory testing system comprising:
   means for comparing a first memory module against a second memory module under actual working conditions in a computing device, wherein said first memory module is known to be working as expected and said second memory module is of unknown quality;
   means for re-driving signals from said computing device to said means for comparing; and
   means for providing information on failure of said second memory module.

2. A synchronous memory testing system as recited in claim 1, wherein said information on failures includes data, address and control signal patterns, and a location of said failure in said second memory module.

3. A synchronous memory testing system as recited in claim 1, wherein said first and second memory modules are of a type of high speed synchronous Dynamnic Random Access Memories (DRAMs) including Dual In-line Memory Modules (DIMMs).

4. A synchronous memory testing system as recited in claim 1, wherein said first and second memory modules operate as high speed synchronous Dynamic Random Access Memories (DRAMs) at memory bus speeds of 66 Mhz or higher.

5. A synchronous memory testing system comprising:
   a computing device having memory; and
   a test assembly connected to a memory module socket in a memory bank of said computing device, performing memory diagnostics and error reporting, wherein said test assembly re-drives clock signals.

6. A synchronous memory testing system recited in claim 5, wherein said computing device is a server, workstation, personal computer (PC) or laptop computer.

7. A synchronous memory testing system as recited in claim 5, wherein said test assembly captures failures and logs information about said failures in real time, generating error signals to permit probing.

8. A synchronous memory testing system as recited in claim 5, wherein said test assembly re-drives data signals to minimize system loading.

9. A synchronous memory testing system as recited in claim 5, wherein said test assembly is implemented in a first and second section to permit form/fit into limited space applications and a reduction of mechanical stress, said first section performing as an adapter card connected to said computing device via a memory module socket, and said second section performing as a diagnostic card connected to said adapter card via at least one high frequency ribbon cable.

10. A synchronous memory testing system as recited in claim 9, wherein said diagnostic card is provided with an independent and separate power supply, permitting said diagnostic card to be fully powered and operational prior to powering up the computing device and associated memory modules, enabling said diagnostic card to detect a first memory fail without delay.

11. A synchronous memory testing system as recited in claim 9, further comprising a logic analyzer connected to said diagnostic card, wherein said logic analyzer displays information on failure of memory modules.

12. A synchronous module adapter card comprising:
   a system interface permitting connection to a memory module socket in a memory bank of a computing device;
   a test card socket for a first memory module;
   a system card socket for a second memory module, wherein said second memory module is of a similar type as said first memory module;
   means for connecting said adapter card to a diagnostic card, enabling data, control and clock signals to be sent from said adapter card to said diagnostic card;
   means for re-driving control, data and clock signals emanating from said computing device and said test card socket and said system card socket, wherein said signals are sent to said diagnostic card; and
   means for probing said adapter card for high and low speed signals.

13. A synchronous module adapter card as recited in claim 12, wherein means for re-driving signals comprises an adjustable clock permitting timing optimization and characterization.

14. A synchronous module adapter card as recited in claim 13, wherein said adjustable clock allows said adapter card to be taller, thereby accommodating additional wire lengths, enabling use with more memory module form factors without interfering with other system components.

15. A synchronous module adapter card as recited in claim 14, wherein said adjustable clock allows multiple memory modules without impacting system loading.

16. A synchronous module adapter card as recited in claim 12, wherein means for re-driving timing signals comprises a logic re-drive or re-clocking circuit.

17. A synchronous module adapter card as recited in claim 16, wherein said logic re-drive allows multiple memory modules without impacting system loading.

18. A synchronous module diagnostic card comprising:
   means for receiving re-driven control and timing signals and data bits from an adapter card;
   control logic comparing a system memory module and a test memory module, wherein said memory modules are connected to said adapter card and data bits are passed to said diagnostic card from said adapter card via said receiving means; and
   means for analyzing and displaying failure information.

19. A synchronous module diagnostic card as recited in claim 18, wherein said means for analyzing and displaying failure information is switch programmable to display only the address in use by said test memory module.

20. A synchronous module diagnostic card as recited in claim 18, wherein said control logic is implemented using field programmable gate arrays (FPGAs) and erasable programmable read only memory (EPROMS), enabling modification of operating characteristics of onboard logic.

* * * * *